United States Patent
Furuya et al.

(10) Patent No.: US 12,116,671 B2
(45) Date of Patent: Oct. 15, 2024

(54) LAMINATE AND METHOD FOR PRODUCING SAME

(71) Applicant: SHOWA DENKO K.K., Tokyo (JP)

(72) Inventors: Akira Furuya, Tokyo (JP); Tadaaki Kojima, Tokyo (JP); Hiroshi Suzuki, Tokyo (JP)

(73) Assignee: Resonac Corporation, Tokyo (JP)

( * ) Notice: Subject to any disclaimer, the term of this patent is extended or adjusted under 35 U.S.C. 154(b) by 103 days.

(21) Appl. No.: 17/614,222

(22) PCT Filed: Sep. 11, 2020

(86) PCT No.: PCT/JP2020/034516
§ 371 (c)(1),
(2) Date: Nov. 24, 2021

(87) PCT Pub. No.: WO2021/070561
PCT Pub. Date: Apr. 15, 2021

(65) Prior Publication Data
US 2022/0228266 A1    Jul. 21, 2022

(30) Foreign Application Priority Data

Oct. 10, 2019    (JP) ................................ 2019-186772

(51) Int. Cl.
*C23C 18/16*    (2006.01)
*B32B 15/01*    (2006.01)
(Continued)

(52) U.S. Cl.
CPC ........ *C23C 18/1651* (2013.01); *B32B 15/015* (2013.01); *C23C 18/1637* (2013.01);
(Continued)

(58) Field of Classification Search
None
See application file for complete search history.

(56) References Cited

U.S. PATENT DOCUMENTS

| 5,373,523 A | 12/1994 | Fujimoto et al. |
| 6,258,411 B1 | 7/2001 | Ohmi et al. |
(Continued)

FOREIGN PATENT DOCUMENTS

| CN | 103668369 A | 3/2014 |
| CN | 108359966 A | 8/2018 |
(Continued)

OTHER PUBLICATIONS

International Search Report dated Oct. 27, 2020 from the International Searching Authority in International Application No. PCT/JP2020/034516.
(Continued)

*Primary Examiner* — Adam Krupicka
(74) *Attorney, Agent, or Firm* — Sughrue Mion, PLLC

(57) ABSTRACT

A laminate including a metallic base material, a nickel-containing plating film layer formed on the metallic base material, and a gold plating film layer formed on the nickel-containing plating film layer, in which pinholes in the gold plating film layer are sealed with a fluorinated passive film having a thickness of 8 nm or greater. Also disclosed is a constituent member of a semiconductor production device including the laminate and a method for producing the laminate.

14 Claims, 1 Drawing Sheet

(51) Int. Cl.
    *C23C 18/44* (2006.01)
    *C23C 18/50* (2006.01)
    *C23C 28/02* (2006.01)
    *C25D 3/12* (2006.01)
    *H01L 21/687* (2006.01)

(52) U.S. Cl.
    CPC ...... *C23C 18/1653* (2013.01); *C23C 18/1689* (2013.01); *C23C 18/44* (2013.01); *C23C 18/50* (2013.01); *C23C 28/021* (2013.01); *C25D 3/12* (2013.01); *H01L 21/68757* (2013.01)

(56) References Cited

U.S. PATENT DOCUMENTS

| | | | |
|---|---|---|---|
| 6,280,597 | B1 | 8/2001 | Kashiwada et al. |
| 2005/0028739 | A1* | 2/2005 | Natsuhara ........... C23C 16/4581 |
| | | | 118/728 |
| 2005/0196634 | A1 | 9/2005 | Abe et al. |
| 2011/0012497 | A1 | 1/2011 | Sumiya et al. |
| 2012/0285720 | A1 | 11/2012 | Chou |
| 2013/0240256 | A1 | 9/2013 | Von Werne |
| 2019/0393173 | A1 | 12/2019 | Sunamoto et al. |

FOREIGN PATENT DOCUMENTS

| | | |
|---|---|---|
| EP | 0 902 101 A1 | 3/1999 |
| EP | 0 902 101 B1 | 2/2003 |
| JP | 6-132582 A | 5/1994 |
| JP | H06-316773 A | 11/1994 |
| JP | 11-165375 A | 6/1999 |
| JP | 2954716 B2 | 9/1999 |
| JP | 3094000 B2 | 10/2000 |
| JP | 2002-241954 A | 8/2002 |
| JP | 2004-360066 A | 12/2004 |
| JP | 2008-56978 A | 3/2008 |
| JP | 2008-260646 A | 10/2008 |
| JP | 2010-037603 A | 2/2010 |
| JP | 2016-160504 A | 9/2016 |
| KR | 10-2013-0114180 A | 10/2013 |
| KR | 10-2018-0132797 A | 12/2018 |
| TW | 201103177 A1 | 1/2011 |
| WO | 2018/150971 A1 | 8/2018 |

OTHER PUBLICATIONS

Written Opinion dated Oct. 27, 2020 from the International Searching Authority in International Application No. PCT/JP2020/034516.
Office Action dated Jun. 25, 2021 from the Taiwanese Intellectual Property Office in corresponding TW application No. 109132667.
Wangen Shu, et al., "Newly Compiled Formula and Production of Practical Chemical Commodities (II)," Central South University of Technology Press, Jun. 1994, pp. 377-378 (6 pages total).
Hai-Xing Liao, et al., "Study on double-deck Ni—P electroless plating", Journal of Central China Normal University, Jun. 2003, vol. 37, No. 2, pp. 197-198 (3 pages total).

* cited by examiner

LAMINATE AND METHOD FOR PRODUCING SAME

CROSS REFERENCE TO RELATED APPLICATIONS

This application is a National Stage of International Application No. PCT/JP2020/034516 filed Sep. 11, 2020, claiming priority based on Japanese Patent Application No. 2019-186772 filed Oct. 10, 2019.

TECHNICAL FIELD

The present invention relates to a laminate and a method for producing the same. More specifically, the present invention relates to a laminate suitable as a constituent member of devices such as semiconductor production devices, and a method for producing the laminate.

BACKGROUND ART

In a semiconductor production process, special halogen gases which are strongly reactive and corrosive such as fluorine, hydrogen chloride, boron trichloride, nitrogen trifluoride, chlorine trifluoride, and hydrogen bromide (these may be hereinafter referred to as "corrosive gas"), have conventionally been used in a dry etching step and in the cleaning of production devices for example.

However, when the above corrosive gas reacts with the moisture contained in an atmosphere and is hydrolyzed, products such as hydrogen fluoride, oxalic acid, and hydrogen chloride are generated. The products are problematic since they easily corrode metallic surfaces of constituent members such as valves, couplings, piping, and reaction chambers during the use of the corrosive gas.

Meanwhile, pinholes on a plating surface may also be a reason why corrosion proceeds. There seem to be several factors in causing pinholes, for example, such that hydrogen gas generated by a plating reaction forms bubbles during the formation of a plating film to inhibit film formation, or such that impurities (such as an oxide film, contamination, and oil) remaining on a base material are not eliminated in a pretreatment step, resulting in the inhibition of film formation.

In order to increase corrosion resistance, methods in which a metallic base material is plated with a nickel-phosphorus alloy to form a fluorinated passive film of nickel have been hitherto performed (see for example Patent Literature 1 to Patent Literature 3). However, the methods are sometimes insufficient.

There is also a method in which a metallic base material is plated with a nickel-tungsten alloy and a thick fluorinated passive film of nickel is formed at a low temperature by utilizing the standard enthalpy of formation of $WF_6$ formed by a fluorination reaction. However, the method, which is electroplating, has a restriction such that members to which the method is applicable are limited (see Patent Literature 4).

CITATION LIST

Patent Literature

Patent Literature 1: JP 2954716 B2
Patent Literature 2: JP 3094000 B2
Patent Literature 3: JP 2004-360066 A
Patent Literature 4: JP 2008-056978 A

SUMMARY OF INVENTION

Technical Problem

What is intended by the present invention is to resolve the above problems associated with conventional art. The objects of the present invention are to provide a metallic material which can be employed as a constituent member of a semiconductor production device and also excels in corrosion resistance, and to provide a method for producing the metallic material.

Solution to Problem

The present invention relates to the following [1] to [12] for example.

[1] A laminate comprising a metallic base material, a nickel-containing plating film layer formed on the metallic base material, and a gold plating film layer formed on the nickel-containing plating film layer, in which pinholes in the gold plating film layer are sealed with a fluorinated passive film having a thickness of 8 nm or greater.

[2] The laminate described in [1], in which the metallic base material comprises at least one metal selected from the group consisting of stainless steel, iron, aluminum, aluminum alloys, copper, and copper alloys.

[3] The laminate described in [1] or [2], having a nickel strike layer between the metallic base material and the nickel-containing plating film layer.

[4] The laminate described in any one of [1] to [3], in which the nickel-containing plating film layer comprises a nickel-phosphorus alloy plating layer (1) having a phosphorus concentration of 8% by mass or higher and lower than 10% by mass, and a nickel-phosphorus alloy plating layer (2) having a phosphorus concentration of 10% by mass or higher and 12% by mass or lower in this order from the metallic base material.

[5] The laminate described in any one of [1] to [4], in which the gold plating film layer comprises a displacement gold plating film layer and a reduction gold plating film layer in this order from the nickel-containing plating film layer.

[6] A constituent member of a semiconductor production device, which is made up of the laminate described in any one of [1] to [5].

[7] A method for producing a laminate, comprising a step forming a nickel-containing plating film layer on a metallic base material, a step (B) of forming a gold plating film layer on the nickel-containing plating film layer, and a sealing treatment step (C) of forming a fluorinated passive film having a thickness of 8 nm or greater in pinholes in the gold plating film layer.

[8] The method for producing a laminate described in [7], in which the sealing treatment step (C) is performed in an atmosphere having a fluorinated gas concentration of 8% by volume or higher and a temperature of 100 to 150° C.

[9] The method for producing a laminate described in [7] or [8], in which the metallic base material comprises at least one metal selected from the group consisting of stainless steel, iron, aluminum, aluminum alloys, copper, and copper alloys.

[10] The method for producing a laminate described in any one of [7] to [9], comprising a step of subjecting the metallic base material to a nickel strike treatment under the condition of a current density being 5 to 20 A/dm$^2$ before the step (A).

[11] The method for producing a laminate described in any one of [7] to [10], in which the step (A) comprises a step (a1) of forming a nickel-phosphorus alloy plating layer (1) having a phosphorus concentration of 8% by mass or higher and lower than 10% by mass, and after the step (a1), a step (a2) of forming a nickel-phosphorus alloy plating layer (2) having a phosphorus concentration of 10% by mass or higher and 12% by mass or lower.

[12] The method for producing a laminate described in any one of [7] to [11], in which the step (B) comprises a step (b1) of forming a displacement gold plating film layer, and after the step (b1), a step of forming a reduction gold plating film layer.

Advantageous Effects of Invention

The present invention is capable of providing laminates having excellent corrosion resistance, particularly excellent corrosion resistance to acids.

DESCRIPTION OF EMBODIMENTS

Figure 1A:
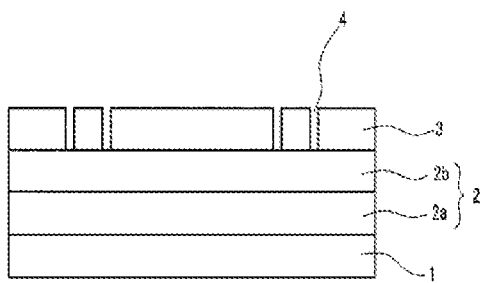
FIG. 1A is a schematic drawing showing a laminate before a sealing treatment and FIG. 1B is a schematic drawing showing a laminate after a sealing treatment.

An embodiment of the present invention is specifically described below.

A laminate of an embodiment of the present invention comprises a metallic base material, a nickel-containing plating film layer formed on the metallic base material, and a gold plating film layer formed on the nickel-containing plating film layer, in which pinholes in the gold plating film layer are sealed with a fluorinated passive film having a thickness of 8 nm or greater.

A method for producing the laminate of the embodiment of the present invention comprises a step (A) of forming a nickel-containing plating film layer on a metallic base material, a step (B) of forming a gold plating film layer on the nickel-containing plating film layer, and a sealing treatment step (C) of forming a fluorinated passive film having a thickness of 8 nm or greater in pinholes in the gold plating film layer.

[Metallic Base Material]

Metallic base materials used in the embodiment of the present invention have at least a surface made up of a metal. The metallic base materials are not particularly limited, and examples thereof are metals generally used in constituent members of semiconductor production devices, preferably including stainless steel, iron, aluminum, aluminum alloys, copper, and copper alloys.

In order to increase the adhesion to a nickel-containing plating film layer, the metallic base materials may be subjected to pretreatment for the step (A) such as degreasing, acid cleaning, or a nickel strike treatment depending on the base materials. The nickel strike treatment is a preliminary plating treatment using a nickel-containing plating bath, in which the current density is preferably 5 to 20 A/dm$^2$, and more preferably 5 to 10 A/dm$^2$. In addition, the nickel strike treatment time is preferably 5 seconds or longer and 5 minutes or shorter.

[Nickel-Containing Plating Film Layer]

A nickel-containing plating film layer is formed on the metallic base material by the step (A). When the metallic base material is subjected to a nickel strike treatment, a nickel strike layer is formed between the metallic base material and the nickel plating film layer.

From the viewpoint of increased corrosion resistance, the nickel-containing plating film layer preferably contains phosphorus, and preferably comprises a nickel-phosphorus alloy plating layer (1) having a phosphorus concentration of 8% by mass or higher and lower than 10% by mass, and a nickel-phosphorus alloy plating layer (2) having a phosphorus concentration of 10% by mass or higher and 12% by mass or lower in this order from the metallic base material.

The nickel-containing plating film layer has a nickel content of preferably 80% by mass or higher, more preferably 85% to 95% by mass, and particularly preferably 88% to 92% by mass in relation to 100% by mass of the entirety of the nickel-containing plating film layer. Due to a nickel content within the above range, the proportion of phosphorus in the film layer increases, which exhibits excellent corrosion resistance. In addition, when electroless nickel-phosphorus alloy plating films having different phosphorus concentrations are laminated, film formation proceeds while forming pinhole defects in different positions. For this reason, disturbance hardly reaches the base material directly, and increased corrosion resistance is anticipated.

<Step (A)>

The nickel-containing plating film layer may be formed on a metallic base material using an electroless plating bath comprising a nickel salt and a phosphorus compound as a reducer. Examples of nickel salts are nickel sulfate, nickel chloride, nickel acetate, and nickel carbonate. Examples of phosphorus compounds are sodium hypophosphite and potassium hypophosphite.

The step (A) preferably comprises a step (a1) of forming the nickel-phosphorus alloy plating layer (1), and a step (a2) of forming the nickel-phosphorus alloy plating layer (2) after the step (a1).

The film formation rate of the nickel-phosphorus alloy plating layer (1) is preferably 20 to 30 μm/h (hour), more preferably 22 to 25 μm/h (hour), and the film formation rate of the nickel-phosphorus alloy plating layer (2) is preferably 10 to 15 μm/h (hour), more preferably 11 to 13 μm/h (hour). The thus-formed nickel-phosphorus alloy plating layers (1) and (2) allow increased corrosion resistance. The nickel-phosphorus alloy plating film layers (1) and (2) each have a film thickness of preferably 5 μm or greater, and more preferably 7 to 25 μm. From the viewpoints of film properties of resisting pinhole formation and cost efficiency, the thickness is still more preferably from 10 to 20 μm.

[Gold Plating Film Layer]

The gold plating film layer is formed on the nickel-containing plating film layer by the step (B).

The gold content in the gold plating film is, relative to 100% by mass of the entirety of the gold plating film layer, preferably 90% by mass or greater, more preferably 99% by mass or greater, and particularly preferably 99.9% by mass or greater. Due to the gold content within the above range, corrosion resistance of the laminate of the embodiment of the present invention is stabilized. The gold content is obtained by a method for quantifying impurities, namely by dissolving gold plating in aqua regia to measure the gold content by atomic absorption spectrometry and inductively coupled plasma (ICP) atomic emission spectrometry.

From the viewpoints of film properties of resisting pinhole formation and cost efficiency, the thickness of the gold plating film is preferably from 0.1 μm to 1 μm, more preferably 0.2 to 0.9 μm, and particularly preferably 0.3 to 0.8 μm. It is publicly known based on conventional art that the thicker the precious metal plating film is, the more the number of pinholes is reduced, and high corrosion resistance is expected to be achievable by increasing the thickness of a precious metal plating film. Considering the high price thereof, however, it is preferred to select an appropriate thickness.

<Step (B)>

Methods for forming the gold plating film layer are not particularly limited and an electroless gold plating method is preferred. In an electroless gold plating method, it is preferred to perform displacement gold plating and thereafter reduction gold plating. Namely, the step (B) preferably comprises a step (b1) of forming a displacement gold plating film layer, and a step (b2) of forming a reduction gold plating film layer after the step (b1).

In displacement gold plating, nickel is dissolved from a nickel film releasing electrons, which reduce gold ions in the solution, and the reduced gold ions in the solution are deposited as a gold plating film. In reduction gold plating, gold ions in the solution are reduced by electrons released due to an oxidation reaction by a reducer, and thereby a gold plating film is deposited.

Examples of electroless gold plating solutions are plating baths containing components such as gold potassium cyanide, gold chloride, gold sulfite, and gold thiosulfate. Examples of reducers are sodium hydroxide, dimethylamine borane, hexamethylenetetramine, and chain polyamines comprising an alkyl group having 3 or more carbon atoms and multiple amino groups.

The gold plating film layer may be formed by performing displacement gold plating preferably at a temperature of 50 to 90° C. for 3 to 7 minutes, more preferably at a temperature of 65 to 75° C. for 3 to 7 minutes, and by performing reduction gold plating preferably at a temperature of 55 to 65° C. for 7 to 15 minutes, more preferably at a temperature of 58 to 62° C. for 7 to 15 minutes.

[Fluorinated Passive Film]

Pinholes in the gold plating film layer are sealed with a fluorinated passive film by subjecting a surface of the gold plating film layer to a fluorination treatment in the step (C).

Figure 1B:
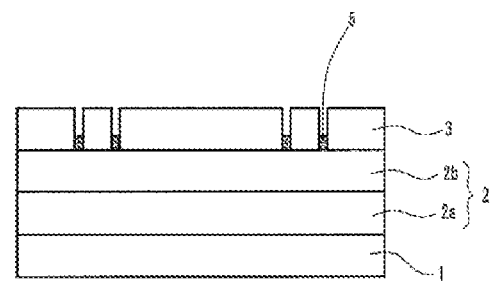

The fluorinated passive film is formed only on an exposed surface of the nickel-phosphorus alloy plating layer (2$b$) in FIG. 1($b$). In other words, the fluorinated passive film is formed while growing only in a vertical direction of the fluorinated passive film 5, without being formed on a side surface inside a pinhole in the gold plating film layer 3 and without being formed on the outermost surface of the gold plating film layer 3. The fluorinated passive film also does not exceed the upper end of the gold plating film layer The thickness of the fluorinated passive film is ordinarily 8 nm or greater, preferably 10 to 20 nm, and more preferably 12 to 18 nm. Due to the thickness of the fluorinated passive film within the above range, the properties of the fluorinated passive film such as durability become practically suitable. The thickness of the fluorinated passive film herein means the length of an obtained laminate in a lamination direction, which is, for example, equivalent to the vertical length of the fluorinated passive film 5 in FIG. 1($b$).

<Step (C)>

In the step (C), a surface of the nickel-containing plating film layer exposed from pinholes in the gold plating film layer that has undergone the steps (A) and (B) is forcibly fluorinated using fluorinated gas to form a fluorinated passive film. Thereby pinholes are subjected to sealing treatment.

The step (C) is performed in an atmosphere having a fluorinated gas concentration preferably of 8% by volume or higher, and more preferably of 10 to 25% by volume. The fluorination temperature is preferably 100 to 150° C., more preferably 105 to 145° C., and furthermore preferably 110 to 140° C.

Fluorinated gas is a gas used for a fluorination treatment, and is a generic name of at least one type of a gas selected from the group consisting of fluorine ($F_2$), chlorine trifluoride ($ClF_3$), and nitrogen fluoride ($NF_3$), or a gas obtained by diluting the above gas with an inert gas.

For example, when chlorine trifluoride is used, the chlorine trifluoride is pyrolyzed at a temperature of 60 to 100° C. to form fluorine radicals, which are usable in a fluorination reaction. In addition, when nitrogen trifluoride is used, the nitrogen trifluoride is decomposed by plasma energy to form fluorine radicals, which are usable in a fluorination reaction.

Examples of dilution gases accompanying the fluorinated gas are inert gases such as nitrogen gas and argon gas, and nitrogen gas is preferred.

When the fluorinated gas is diluted for use, the concentration may be appropriately determined in accordance with reaction conditions. In the case of fluorine, for example, usage is preferably with a concentration of approximately 10% when factors such as cost are taken into account.

When the metallic base material is stainless steel, fluorination is performed at a temperature of preferably 150 to 190° C., more preferably 155 to 175° C., and when the metallic base material is an aluminum alloy, fluorination is performed at a temperature of preferably 140 to 160° C., more preferably 145 to 155° C. The film formation temperature within the above range allows well-balanced thermal diffusion between electroless nickel-alloy plating and gold plating.

Fluorination treatment time varies in accordance with the thickness of a fluorinated passive film to be formed, and the amount of time required for exhibiting excellent corrosion resistance is preferably 20 to 100 hours, and more preferably 30 to 80 hours.

EXAMPLES

The present invention is more specifically described below with reference to, but not limited to, examples.

Example 1

<Step (A)>

A surface of stainless steel (SUS316L) that was worked into a test piece having a size of 15 mm (length)×15 mm (width)×1 mm (thickness) was subjected to a pretreatment comprising degreasing, acid cleaning, and a nickel strike treatment. The acid cleaning was performed using hydrochloric acid as a cleaning agent at room temperature for 25 seconds.

On a surface of the stainless steel that underwent the nickel strike treatment, an electroless nickel-phosphorus alloy plating film layer (1) having a phosphorus content of 8% by mass or greater and less than 10% by mass in the formed film was formed using an electroless nickel-phosphorus plating chemical "NIMUDEN (trade name) NSX" (produced by C. Uyemura & Co., Ltd.) under the conditions of the plating temperature being 90° C. and the pH value being 4.5 to 4.8, at a film formation rate of 10 μm/25 minutes. Subsequently, an electroless nickel-phosphorus alloy plating film layer (2) having a phosphorus content of 10% by mass or greater to 12% by mass or less in the formed film was formed using an electroless nickel-phosphorus plating chemical "NIMUDEN (trade name) HDX" (produced by C. Uyemura & Co., Ltd.) at a film formation rate of 10 μm/50 minutes. Thereby a nickel-containing plating film layer having a total thickness of 20 was formed on the stainless steel that underwent the nickel strike treatment.

<Step (B)>

Two types of electroless gold plating solutions "Flash Gold NC (displacement type)" and "Self Gold OTK-IT (reduction type)" (both produced by Okuno Pharmaceutical Co., Ltd.,) were used in this order. On the nickel-containing plating film layers formed in the step (A), a treatment at a displacement plating temperature of 70° C. for 5 minutes and a treatment at a reduction plating temperature of 60° C. for 10 minutes were each performed in this order no form gold plating film layers having a total thickness of 0.6 μm.

<Step (C)>

The stainless steel having the nickel-containing plating film layer and the gold plating film layer formed in the steps (A) and (B) was placed inside an atmospheric pressure gas-phase flow reactor, and the temperature inside the reactor was increased to 115° C. Thereafter, the atmosphere was replaced with nitrogen gas, followed by the introduction of 10% by volume of fluorine gas diluted with nitrogen gas to replace the nitrogen gas in the reactor with 10% by volume of fluorine gas. After complete replacement, the state was maintained for 36 hours, and exposed parts of the substrate electroless nickel-phosphorus film, which were exposed due to pinholes formed during the gold plating, were forcibly fluorinated to form a fluorinated passive film. The obtained fluorinated passive film was analyzed with W-SEM "JSM-IT200" (produced by JEOL Ltd). It was confirmed that the film thickness of the fluorinated passive film was 10 nm. The film thickness of the fluorinated passive film herein means the length of an obtained laminate in a lamination direction, which is, for example, equivalent to the vertical length of the fluorinated passive film 5 in FIG. 1(b).

Example 2

A fluorinated passive film, was formed in the same manner as described in Example 1 except for changing the time of the forcible fluorination using 10% by volume of fluorine gas diluted with nitrogen gas in the step (C) described in Example 1 to 72 hours. The thickness of the obtained fluorinated passive film was determined in the same manner as described in Example 1. It was confirmed that the film thickness was 13 nm.

Example 3

An aluminum alloy (A5052) was used instead of the stainless steel (SUS316L) in Example 1, a pretreatment comprising degreasing, activation treatment, acid cleaning, and a zinc replacement treatment was performed, and thereafter the steps (A) and (B) were performed in the same manner as described in Example 1.

The activation treatment was performed using an acid mixture of ammonium acid fluoride and nitric acid as a treating agent at room temperature for 30 seconds. The acid cleaning was performed using nitric acid as a cleaning agent at room temperature for 25 seconds. The zinc replacement treatment was performed using a zincate bath as a treating agent at rooms temperature for 25 seconds. The acid cleaning and the zinc replacement treatment were each performed twice under the above conditions.

In the step (C), a fluorinated passive film was formed on the gold plating film in the same manner as described in Example 2 except for adjusting the forcible fluorination temperature to 105° C. The thickness of the obtained fluorinated passive film was determined in the same manner as described in Example 1. It was confirmed that the film thickness was 10 nm.

Comparative Example 1

By performing only the step (A) described in Example 1 a nickel-containing plating film layer having a total thickness of 20 μm was formed on a surface of stainless steel.

Comparative Example 2

After performing the steps (A) and (B) described in Example 1, the stainless steel having nickel-containing plating film layers and a gold plating film layer, was exposed to the atmosphere to form a natural oxide film. The thickness of the obtained natural oxide film was determined in the same manner as described in Example 1. It was confirmed that the film thickness was 7 nm.

Comparative Example 3

The step (A) described in Example 1 was performed and thereafter the following treatment was performed. The stainless steel having a nickel-containing plating film layer was placed inside the atmospheric pressure gas-phase flow reactor, and the temperature inside the reactor was increased. to 300° C. Thereafter, the atmosphere was replaced with nitrogen gas, followed by the introduction of 100% by volume of oxygen gas to replace nitrogen gas with oxygen gas. After complete replacement, the state was maintained for 12 hours. Subsequently, 10% by volume of fluorine gas diluted with nitrogen gas was introduced and this state was maintained for 12 hours to form a nickel fluoride ($NiF_2$) film on the nickel-containing plating film layer. Thereafter, nitrogen gas was injected for 12 hours to stabilize the formed film.
[Evaluation]

The films on the surfaces of the metallic base materials obtained in the above Examples 1 to 3 and the Comparative Examples 1 to 3 were evaluated by the method below. The evaluation results are summarized in Table 1.
<Hydrochloric Acid Corrosion Resistance Test>

A test piece in a size of 15 mm (length)×15 mm (width)×1 mm (thickness) was immersed in a 35% by mass hydrochloric acid solution at a temperature of 25° C. for 5 hours. Based on the reduced amount of mass [$mg/dm^2$] before and after the immersion, hydrochloric acid corrosion resistance was evaluated in accordance with the following criteria.
(Evaluation Criteria)
  A.: less than 0.1 $mg/dm^2$
  B: 0.1 $mg/dm^2$ or greater and less than 3 $mg/dm^2$
  C: 3 $mg/dm^2$ or greater

TABLE 1

|  | Example 1 | Example 2 | Example 3 | Comparative Example 1 | Comparative Example 2 | Comparative Example 3 |
|---|---|---|---|---|---|---|
| Metallic base material | SUS | SUS | Al | SUS | SUS | SUS |
| Nickel-containing plating film layer | Formed | Formed | Formed | Formed | Formed | Formed |
| Gold plating film layer | Formed | Formed | Formed | Not formed | Formed | Not formed |
| Sealing treatment | Performed | Performed | Performed | Not performed | Performed | Not performed |
| Thickness of fluorinated passive film [nm] | 10 | 13 | 10 | — | — | — |
| Thickness of natural oxide film [nm] | — | — | — | — | 7 | — |
| $NiF_2$ treatment | Not performed | Not performed | Not performed | Not performed | Not performed | Performed |
| Hydrochloric acid corrosion resistance | B | A | B | C | C | C |

In the table, SUS means stainless steel (SUS316L) and Al means an aluminum alloy (A5052).

REFERENCE SIGNS LIST

1 Metallic base material
2 Nickel-containing plating film layer
2a Nickel-phosphorus alloy plating layer (1)
2b Nickel-phosphorus alloy plating layer (2)
3 Gold plating film layer
4 Pinhole
5 Fluorinated passive film

The invention claimed is:

1. A laminate comprising a metallic base material, a nickel-containing plating film layer formed on the metallic base material, and a gold plating film layer formed on the nickel-containing plating film layer,
   wherein pinholes in the gold plating film layer are sealed with a fluorinated passive film having a thickness of 8 nm or greater, and
   wherein the nickel-containing plating film layer comprises a nickel-phosphorus alloy plating layer (1) having a phosphorus concentration of 8% by mass or higher and lower than 10% by mass, and a nickel-phosphorus alloy plating layer (2) having a phosphorus concentration of 10% by mass or higher and 12% by mass or lower in this order from the metallic base material.

2. The laminate according to claim 1, wherein the metallic base material comprises at least a metal selected from the group consisting of stainless steel, iron, aluminum, aluminum alloys, copper, and copper alloys.

3. The laminate according to claim 1, having a nickel strike layer between the metallic base material and the nickel-containing plating film layer.

4. A constituent member of a semiconductor production device, made up of the laminate according to claim 1.

5. A laminate comprising a metallic base material, a nickel-containing plating film layer formed on the metallic base material, and a gold plating film layer formed on the nickel-containing plating film layer,
   wherein pinholes in the gold plating film layer are sealed with a fluorinated passive film having a thickness of 8 nm or greater, and
   wherein the gold plating film layer comprises a displacement gold plating film layer and a reduction gold plating film layer in this order from the nickel-containing plating film layer.

6. The laminate according to claim 5, wherein the metallic base material comprises at least a metal selected from the group consisting of stainless steel, iron, aluminum, aluminum alloys, copper, and copper alloys.

7. The laminate according to claim 5, having a nickel strike layer between the metallic base material and the nickel-containing plating film layer.

8. A constituent member of a semiconductor production device, made up of the laminate according to claim 5.

9. A method for producing the laminate according to claim 1, comprising
   a step (A) of forming a nickel-containing plating film layer on a metallic base material,
   a step (B) of forming a gold plating film layer on the nickel-containing plating film layer, and
   a sealing treatment step (C) of forming a fluorinated passive film having a thickness of 8 nm or greater in pinholes in the gold plating film layer.

10. The method for producing the laminate according to claim 9, wherein the sealing treatment step (C) is performed in an atmosphere in which a fluorinated gas concentration is 8% by volume or higher and a temperature is 100 to 150° C.

11. The method for producing the laminate according to claim 9, wherein the metallic base material comprises at least one metal selected from the group consisting of stainless steel, iron, aluminum, aluminum alloys, copper, and copper alloys.

12. The method for producing the laminate according to claim 9, comprising a step of subjecting the metallic base material to a nickel strike treatment under the condition of a current density of 5 to 20 A/dm$^2$ before the step (A).

13. The method for producing the laminate according to claim 9, wherein the step (A) comprises a step (a1) of forming a nickel-phosphorus alloy plating layer (1) having a phosphorus concentration of 8% by mass or higher and lower than 10% by mass, and a step (a2) of forming a nickel-phosphorus alloy plating layer (2) having a phosphorus concentration of 10% by mass or higher and 12% by mass or lower after the step (a1).

14. The method for producing the laminate according to claim 9, wherein the step (B) comprises a step (b1) of forming a displacement gold plating film layer, and a step (b2) of forming a reduction gold plating film layer after the step (b1).

* * * * *